United States Patent
Oh

(10) Patent No.: US 7,405,992 B2
(45) Date of Patent: Jul. 29, 2008

(54) METHOD AND APPARATUS FOR COMMUNICATING COMMAND AND ADDRESS SIGNALS

(75) Inventor: Jong-Hoon Oh, Chapel Hill, NC (US)

(73) Assignee: Qimonda North America Corp., Cary, NC (US)

( * ) Notice: Subject to any disclaimer, the term of this patent is extended or adjusted under 35 U.S.C. 154(b) by 10 days.

(21) Appl. No.: 11/552,752

(22) Filed: Oct. 25, 2006

(65) Prior Publication Data

US 2008/0106967 A1 May 8, 2008

(51) Int. Cl.
*G11C 8/00* (2006.01)

(52) U.S. Cl. ............... 365/230.02; 365/63; 365/230.06

(58) Field of Classification Search ............... 365/63, 365/230.02, 230.06
See application file for complete search history.

(56) References Cited

U.S. PATENT DOCUMENTS

2004/0128433 A1* 7/2004 Bains ................... 711/106

* cited by examiner

*Primary Examiner*—Hoai V Ho
(74) *Attorney, Agent, or Firm*—Patterson & Sheridan, L.L.P.

(57) ABSTRACT

Apparatus and methods for communicating command and address inputs to a memory device. In one embodiment, a memory device includes a shared bus interface defined by a portion of pins from a command bus interface and a portion of pins from an address bus interface. Each portion of pins is configured to receive address and command inputs, depending a given command/address combination being asserted by a memory controller.

18 Claims, 6 Drawing Sheets

METHOD AND APPARATUS FOR COMMUNICATING COMMAND AND ADDRESS SIGNALS

BACKGROUND OF THE INVENTION

Modern computer systems typically include a memory device which may be accessed and/or controlled by a control device such as a memory controller. The memory controller may communicate with the memory device via one or more busses. For example, the memory controller and the memory device may be coupled by a command bus and an address bus. The command bus is configured to provide one or more control signals to the memory device, while the address bus is configured to provide address signals to the memory device. As an example, in a given clock cycle, data may be read out from the memory device by transmitting, from the memory controller to the memory device, a plurality of control signals and address signals over the command bus and address bus, respectively. The input signals are then decoded by the memory device, after which the requested data is returned to the memory controller.

A given command or address is typically defined by a plurality of inputs propagated over the respective command bus (in the case of a command) or address bus (in the case of an address). Each input is provided to a corresponding pin on a respective interface of the memory device. Thus, a given command/address input combination in a given cycle may require N command inputs to N pins of a command bus interface on the memory device, and P address inputs to P pins of an address bus interface on the memory device.

One of the design considerations in manufacturing memory devices, is the number of input pins required to support the various combinations of commands and addresses. The greater the number of pins required, the larger and the more costly the resulting memory device is.

Therefore, there is a need for reducing the number of pins needed to interface a memory with a control device, such as a memory controller or processor).

SUMMARY OF THE INVENTION

Embodiments of the invention generally provide methods and apparatus for communicating signals over shared interfaces.

One embodiment provides a memory device having a command bus interface with one or more command pins dedicated to receiving command inputs and one or more shared pins for selectively receiving address inputs and command inputs; and an address bus interface having one or more address pins dedicated to receiving address inputs and one or more shared pins for selectively receiving address inputs and command inputs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide apparatus and methods for communicating command and address inputs to a memory device.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal name used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Figure 1:
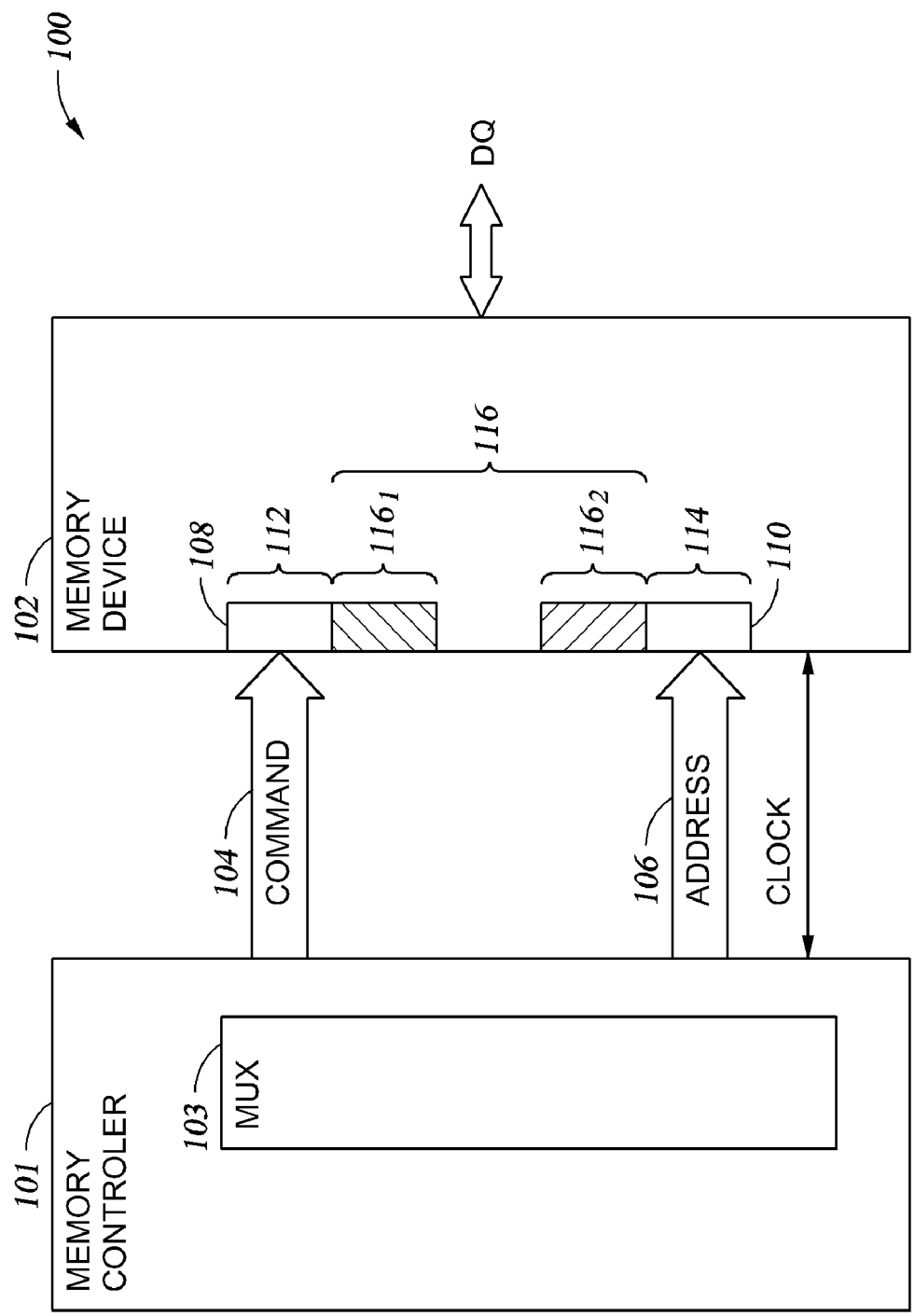
FIG. 1 is a block diagram depicting a memory device and controller, according to one embodiment of the invention.

FIG. 1 is a block diagram depicting an apparatus 100 according to one embodiment of the invention. Illustratively, the apparatus 100 includes a memory controller 101 and a memory device 102. The memory device 102 may be any of a variety of types of memory. For example, in the illustrative embodiment, the memory device 102 is synchronous dynamic random access memory (SDRAM). The SDRAM may be single data rate SDRAM, double data rate (DDR) SDRAM or any subsequent generation of multiple data rate SDRAM (e.g., DDR-III SDRAM). Alternatively, the memory device 102 may be DDR synchronous graphics RAM (SGRAM), DDR fast cycle RAM (FCRAM), SRAM, or any other suitable memory device or combinations of the above mentioned memory devices.

In the case of SDRAM, command and address inputs to the memory device 102 are clocked on a clock signal (CLK) issued by the controller 101. As will be described in more detail below, the controller 101 may issue any number of predefined command/address combinations. To this end, the controller 101 may include a multiplexer (MUX) 103 configured to selectively output a desired command/address combination.

In one embodiment, the memory device 102 is coupled to the memory controller 101 by a command bus 104 and an address bus 106. The command bus 104 provides inputs to a first plurality of pins 108 of the memory device 102, while the address bus 106 provides inputs to a second plurality of pins 110 of the memory device 102. In one embodiment, a portion 112 of the first plurality pins 108 is dedicated to receiving command inputs (which may be referred to herein as command pins 112, or command input interface) and a portion 114 of the second plurality pins 110 is dedicated to receiving address inputs (which may be referred to herein as address pins 114, or address input interface). Further, a shared portion $116_1$ of the first plurality of pins 108 and a shared portion $116_2$ of the second plurality of pins 110 collectively form a shared interface 116. The shared interface 116 is configured to variably receive command inputs and address inputs. That is, for a given cycle, the pins of the shared interface 116 receive command inputs and/or address inputs.

Accordingly, for any given cycle the command bus 104 and the address bus 106 may carry address inputs and command inputs, respectively. As such, it should be understood that referring to the bus 104 as the command bus and the bus 106 as the address bus is partially arbitrary, and done for convenience. However, since it is contemplated that a portion of the width of the command bus 104 may be reserved for command inputs (corresponding to the command pins 112) and a portion of the width of the address bus 106 may be reserved for address inputs (corresponding to the address pins 114), reference to the "command bus" and "address bus" retains some inherent meaning. More generally, reference may be made to a first bus and a second bus each having some number of "fixed" or "dedicated" pins dedicated to a particular type of input (command or address) and some number of "variable" pins (of the shared interface 116) which may be allocated to different types of inputs in any given cycle.

In one embodiment, the memory controller 101 and the memory device 102 conform the Joint Electron Device Engineering Council (JEDEC) Low Power Double Data Rate (LP-DDR) synchronous dynamic random access memory (SDRAM) Specification. Accordingly, the buses 104 and 106 may support propagation of any variety of signals, such as write enable (WE), row access strobe (RAS), column access strobe (CAS), and chip select (CS). However, the particular interface nomenclature used herein is merely illustrative and is not limiting of the invention.

Figure 2:
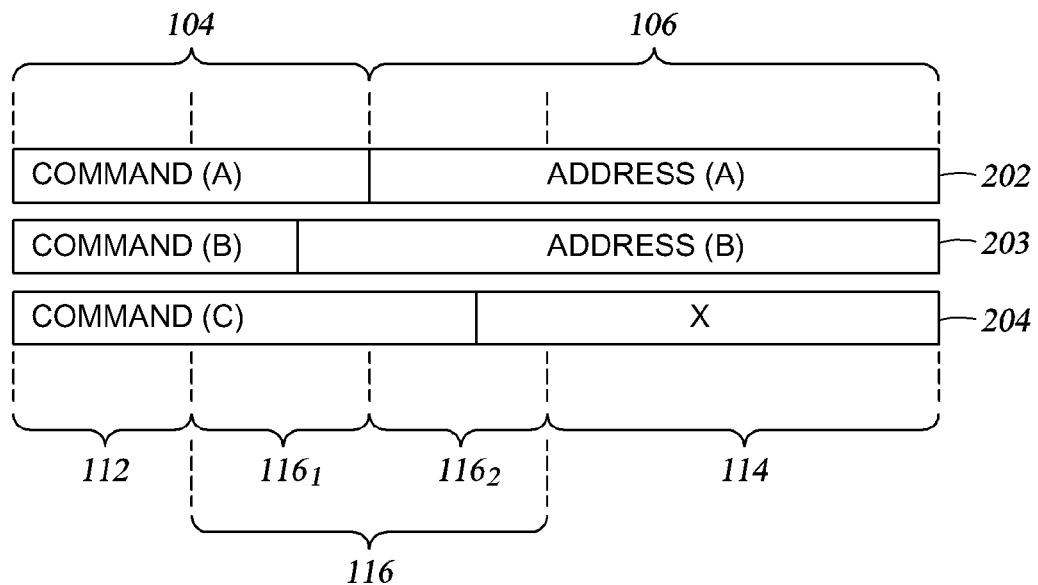
FIG. 2 is a block diagram depicting command and address inputs, according to one embodiment of the invention.

Referring now to FIG. 2, a first pin allocation diagram depicting command and address inputs according to one embodiment of the invention is shown. FIG. 2 corresponds to a single data rate environment in which data is transitioned only on the rising edge of CLK. Illustratively, FIG. 2 shows representative pin allocations 202-204 for three different commands: Command_A, Command_B and Command_C. Each of the commands may correspond to a category of commands such that Command_A, Command_B and Command_C each represent two or more different commands. For example, Command_A may represent Activate, CAS and RAS commands and Command_B may represent precharge, read and write commands. The commands of the Command_A and Command_B categories may require address decoding logic on the memory device 102. In contrast, Command_C may represent commands requiring "valid input" to be issued by the memory controller 101. As used herein, "valid input" refers to input other than address input used to select a memory location. Examples of Command_C type control signals include MRS (mode register set), EMRS (extended mode register set), MRR (mode register read), etc. The input for the MRS signal, for example, may be the value to be stored in the mode register.

FIG. 2 shows the width of the command bus 104 and the address bus 106 at the top of the figure for the three illustrative pin allocations 202-204. Further, the portion of the bus widths corresponding to the dedicated command pins 112, the dedicated address pins 114 and the shared pins 116 is also shown, at the bottom of the figure. The first pin allocation 202 illustrates a scenario in which a first command (of the Command_A category) is accommodated by the width of the command bus and associated pins. Further, a corresponding Address_A is accommodated by the width of the address bus and associated pins. In contrast, the second pin allocation 203 illustrates a scenario in which a second address, Address_B, associated with a second command (of the Command_B category) requires more address pins than were required for Address_A. Accordingly, a portion of the command bus 104 is used ("borrowed") for additional address input. More specifically, a portion of the pins of the shared interface 116 (in particular one or more of the shared pins $116_1$ of the command bus 104) are used to propagate address inputs corresponding to a part of Address_B.

The third pin allocation 204, on the other hand, illustrates a scenario in which a third command (of the Command_C category) requires more command pins than were required for the first and second command categories. Accordingly, a portion of the address bus 106 is used for command input. More specifically, a portion of the pins of the shared interface 116 (in particular one or more of the shared pins $116_2$ of the address bus 106) are used to propagate command inputs corresponding to a part of the third command. The remaining inputs are designated as "don't care" (X).

In one embodiment, the various pin allocations (i.e. combinations of command and address inputs) are predefined. Thus, for each command, a predefined number of address pins is associated with the command. In this way, it can be determined for a given command which of the pins of the shared interface 116 are available for use as address input pins and which are available for use as command input pins. In one embodiment, this determination can be made by the memory device 102, as will be described below.

Figure 3:
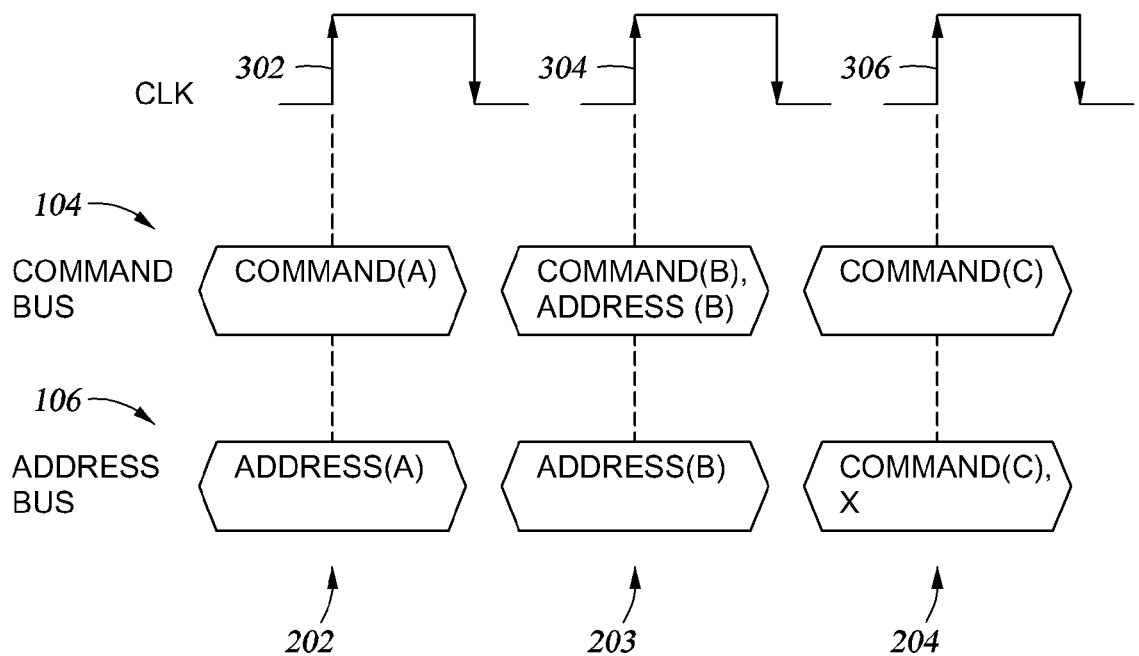
FIG. 3 is a timing diagram depicting command and address inputs, according to one embodiment of the invention.

Referring now to FIG. 3, a first timing diagram depicting command and address inputs according to one embodiment of the invention is shown. More specifically, FIG. 3 corresponds to the pin allocation representations 202-204 shown in FIG. 2. At a first rising clock edge 302, command and address inputs corresponding to the first pin allocation 202 are transferred over the command bus 104 and address bus 106 to the memory device 102 (shown in FIG. 1). Recall that in the first pin allocation 202 the command bus 104 has a sufficient width to carry all of the associated command inputs, while the address bus 106 has a sufficient width to carry all of the associated address inputs. Accordingly, only one or more command inputs are placed on the command bus 104 and only one or more address inputs are placed on the address bus 106 at the first rising clock edge 302.

In contrast, in the case of the second pin allocation 203, the Address_B associated with the Command_B require more pins than are available on the address bus 106. Accordingly, at a second clock edge 304 a combination of command inputs and address inputs are placed on the command bus 104, while the remaining address inputs are placed on the address bus 106. Again, one or more of the shared pins $116_1$ of the command bus 104 are used to propagate address inputs corresponding to a part of Address_B.

The bus allocation for the third pin count 204 is illustrated at a third rising clock edge 306. In this case, command inputs are clocked out on the command bus 106 and address bus 106. Illustratively, the full width of the command bus 104 is used and an excess portion of the address bus 106 is designated as "don't care" (X).

In another embodiment, the bus/pin borrowing strategies of the present invention are applied in multiple data rate environments. By way of example, double data rate embodiments of the invention will be described with reference to FIGS. 4-5.

Figure 4:
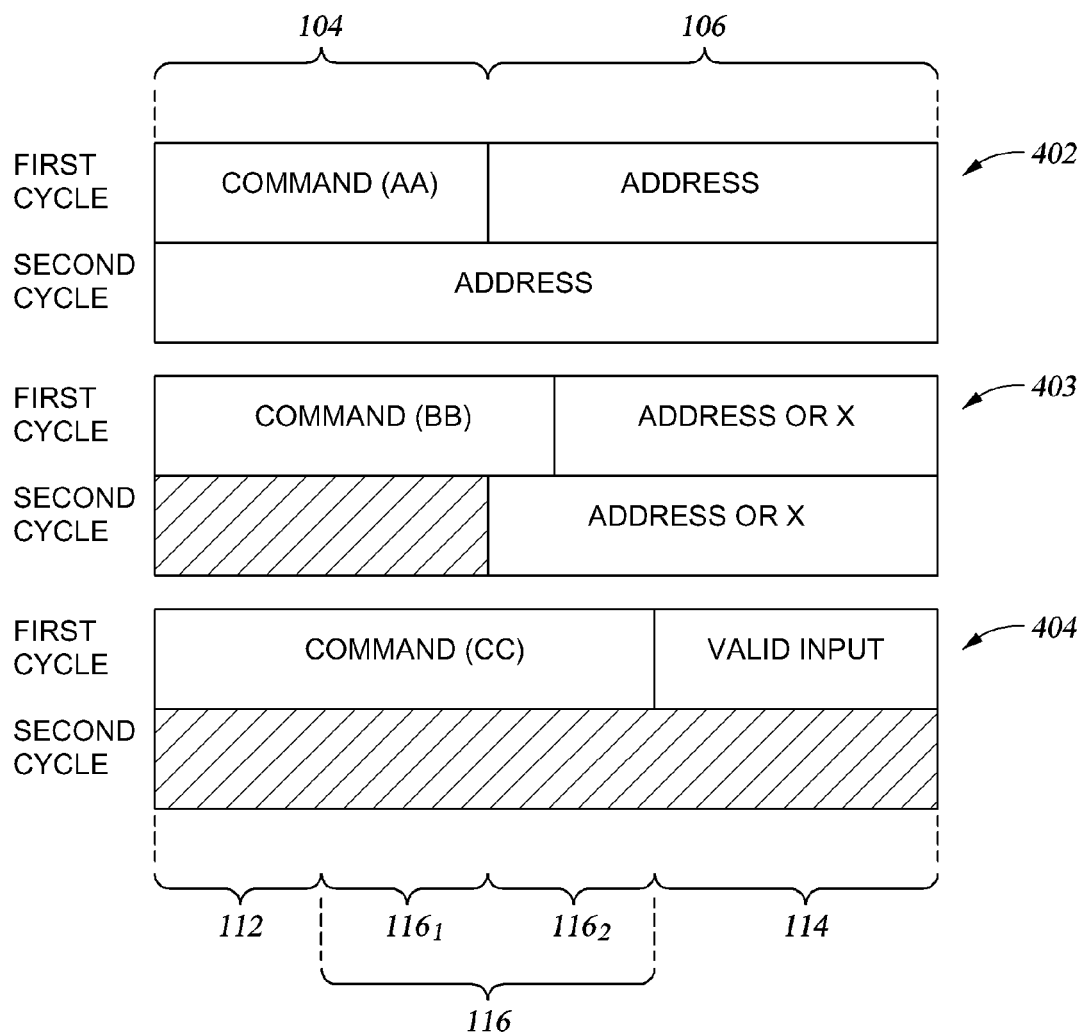
FIG. 4 is a block diagram depicting multiple cycle command and address inputs, according to one embodiment of the invention.
Figure 5:
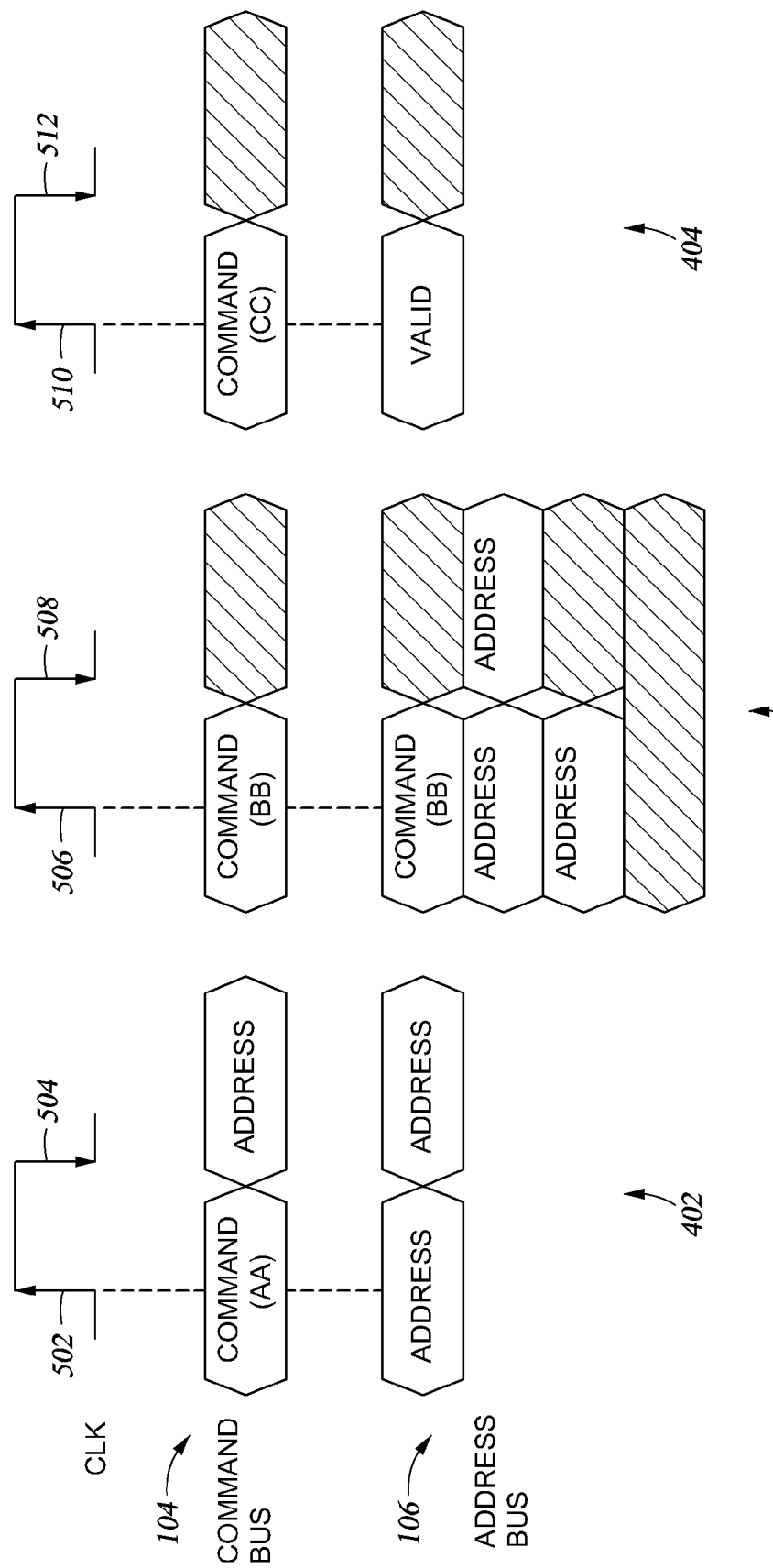
FIG. 5 is a timing diagram depicting multiple cycle command and address inputs, according to one embodiment of the invention.

Referring now to FIG. 4, a pin allocation diagram depicting command and address inputs corresponds to a double data rate environment in which data is transitioned on the rising and falling edges of CLK, according to one embodiment of the invention is shown. Illustratively, FIG. 4 shows representative pin allocations 402-404 for three different commands: Command_AA, Command_BB and Command_CC. Each of the commands may correspond to a category of commands such that Command_AA, Command_BB and Command_CC each represent two or more different commands, as was described with respect to FIG. 2. These commands may be the same categories of commands described above. In contrast to the pin allocations shown in FIG. 2, the pin allocations 402-404 shown in FIG. 4 illustrate allocations for a first cycle and a second cycle corresponding to a rising edge and falling edge, respectively, of the clock (CLK). The corresponding timing diagrams for the pin allocations 402-404 are shown in FIG. 5. The illustrative pin allocations will be described with respect to FIG. 4 and FIG. 5, simultaneously.

The first pin allocation 402 illustrates a command/address combination in which more address pins are required than are made available by the address bus 106. Accordingly, during a first cycle (rising edge 502 of CLK) the Command_AA is clocked out on the command bus 104 and a portion of the Address_AA is clocked out on the address bus 106. During a second cycle (falling edge 504 of CLK) at least portion of the command bus and corresponding pins are used for address inputs and the address bus 106 is used for address inputs. Thus, the Command_AA was clocked out to the memory device 102 in the first cycle and the Address_AA required both cycles to be clocked out. Although FIGS. 4 and 5 suggest that the entire command bus 104 is used for address inputs, it is understood that, according to one embodiment, only the shared pins 116₁ associated with the command bus 104 are used for the address inputs during the second cycle, as some pins (the command pins 112) are dedicated exclusively for control signals.

The second pin allocation 403 illustrates a command/address combination in which more command pins are required than are made available by the command bus 104. Accordingly, during a first cycle (rising edge 506 of CLK) a first portion of the Command_BB is clocked out on the command bus 104 and a second portion of the Command_BB is clocked out on the address bus 106. Any remaining portion of the address bus 106 during the first cycle may be used for address inputs or, alternatively, "don't care" inputs. For purposes of illustration, FIG. 5 shows a plurality of separately itemized address pins and the associated information (i.e., command, address or "don't care") being propagated thereon. During a second cycle (falling edge 508 of CLK), "don't care" inputs are asserted on the command bus and the signals asserted on the address bus may either be address inputs or "don't care" inputs.

The third pin allocation 404 illustrates a command/address combination in which valid input (defined above) is required for a corresponding command (Command_CC). Accordingly, during a first cycle (rising edge 510 of CLK) a Command_CC is clocked out on the command bus 104 and valid input is clocked out on the address bus 106. During a second cycle (falling edge 512 of CLK), "don't care" inputs are asserted on the command bus and the address bus.

Figure 6:
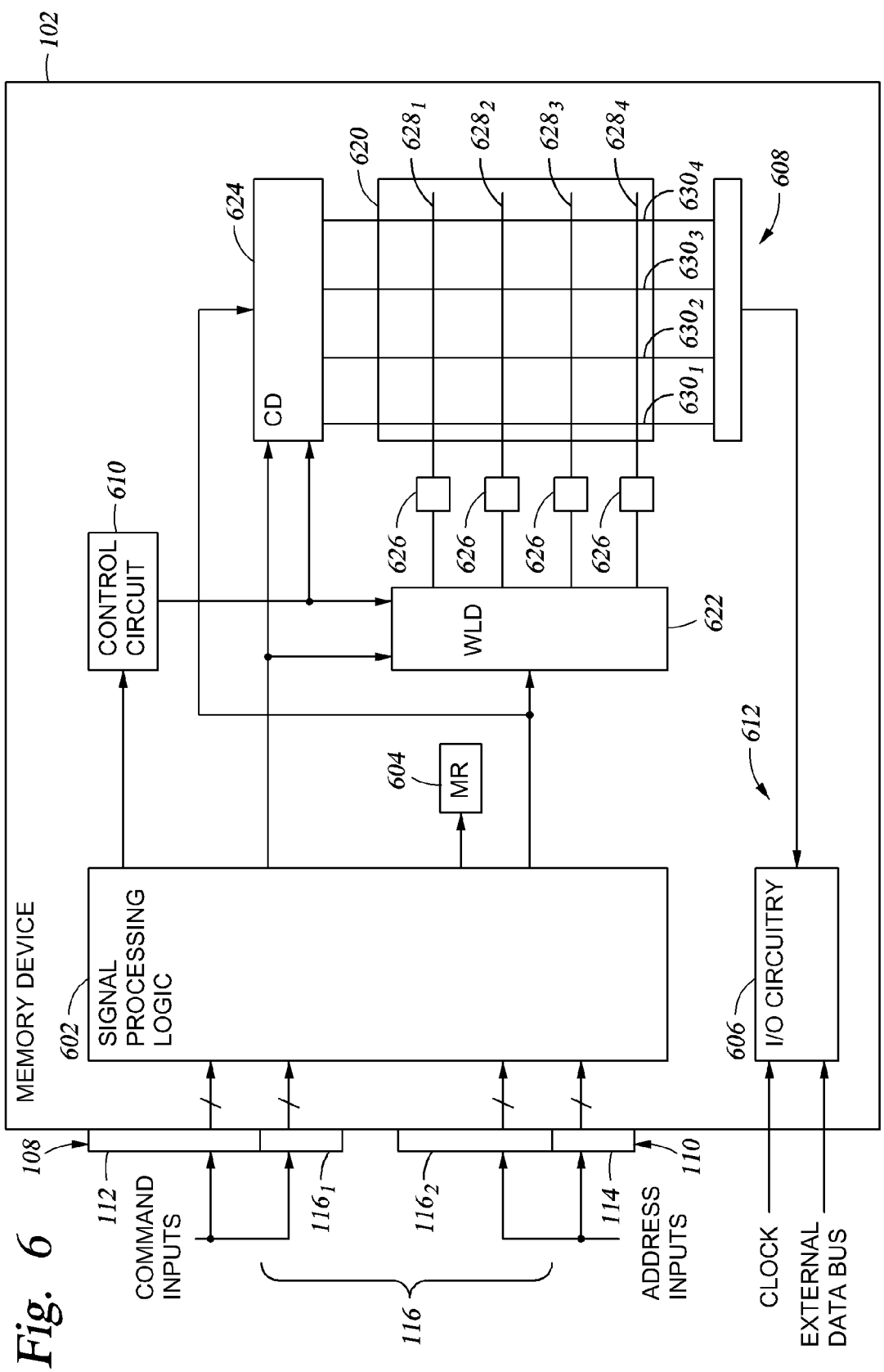
FIG. 6 is a block diagram depicting a memory device, according to one embodiment of the invention.

In one embodiment of the invention the memory device 102 is configured with appropriate logic to process the incoming command and address inputs. FIG. 6 is a representation of the memory device 102 having signal processing logic 602, according to one embodiment of the invention. The various inputs to the processing logic 602 are provided via the first plurality of pins 108 (corresponding to the command bus 104) and the second plurality of pins 110 (corresponding to the address bus 106). As illustrated, only command inputs are received at the dedicated command pins 112 of the first plurality of pins 108 and only address inputs are received at the dedicated address pins 114 of the second plurality of pins 110. Depending upon the particular command/address combination, either command inputs or address inputs are provided to the first set of shared pins 116₁ and the second set of shared pins 116₂ that make up the shared interface 116. The processing logic 602 may include any appropriate decoding circuitry and other circuitry needed for decoding the inputs and outputting appropriate signals to other components of the memory device 102. One embodiment of the processing logic 602 is described below with respect to FIG. 7.

FIG. 6 shows various other components and inputs which may be part of the memory device 102. Illustratively, the clock input (CLK) and external data bus (DQ) may be received by input/output (I/O) circuitry 606 and used to input and output data corresponding to access commands and addresses received via the command and address inputs.

During an access, the address inputs may be used by a wordline decoder 622 and column decoder 624 to access memory cells in a memory bank/array 620. In some cases, multiple memory banks 620 may be accessed using a single wordline decoder 622 and column decoder 624. For example, using a received address, the column decoder 620 may select bitlines 630 of the memory bank 620 to be accessed. Similarly, the wordline decoder 626 may select wordlines 628 to be accessed using the received address. In some cases, an access may also occur based on an address which is internally generated.

During an access, after an address has been used to select wordlines and bitlines in the memory bank 620, data may be written to and/or read from the memory bank 620 via internal read/write circuitry 608 which may include circuitry such as sense amps, output buffers, etc. Data for the access may be transmitted between the read/write circuitry 608 for the memory bank 620 and the external I/O circuitry 606 via one or more internal data buses 612.

While depicted with respect to a single memory bank 620, the memory device 102 may also include additional memory banks as known to those skilled in the art. Furthermore, the combination of features and elements described above with respect to FIG. 6 is merely one example of a memory device configuration with which embodiments of the invention may be used. Further, the memory device 102 may include any variety of additional components not shown in FIG. 6 and which are well known to those skilled in the art. In general, embodiments of the invention may be utilized with any type of memory device.

Figure 7:
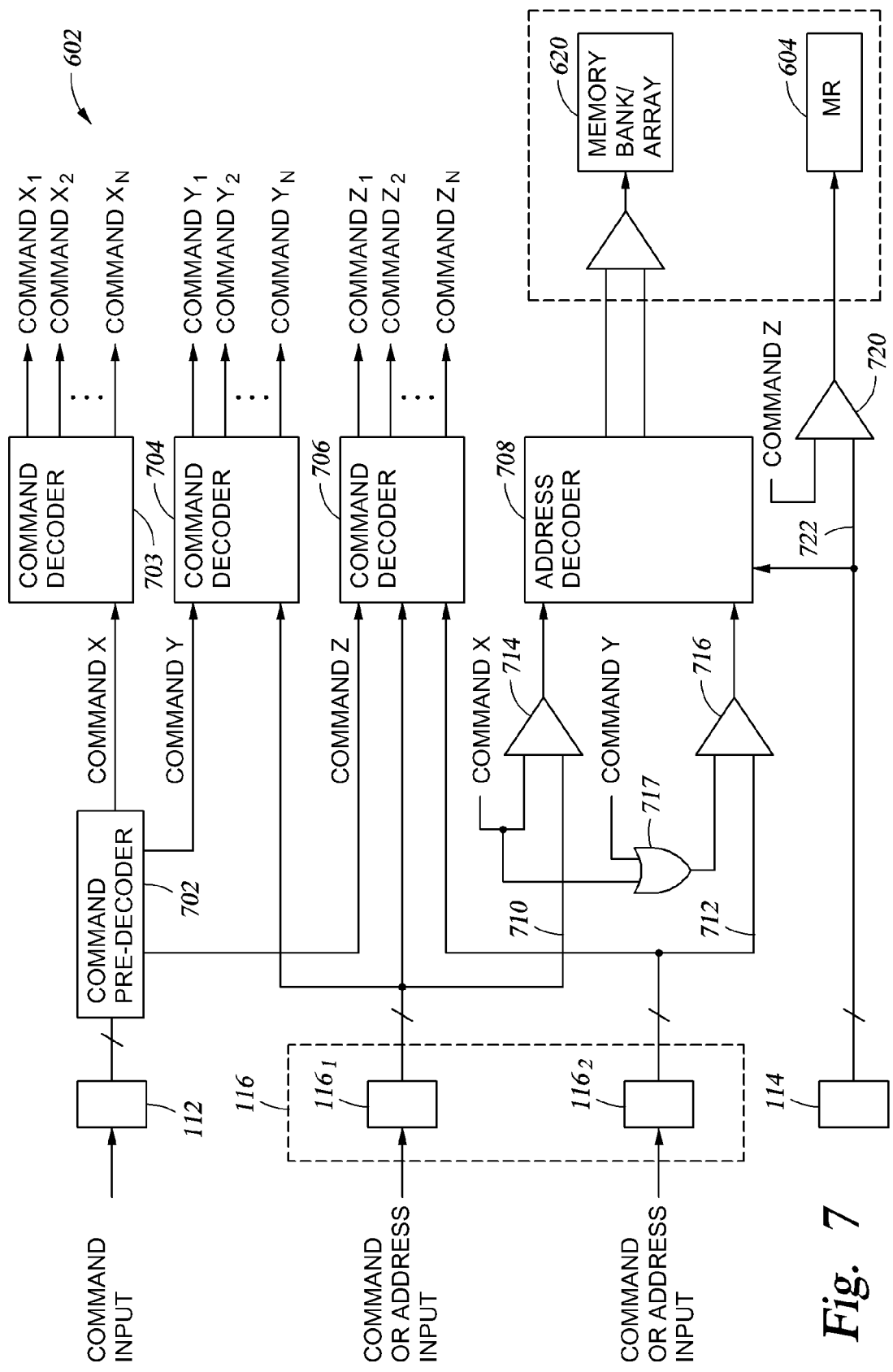
FIG. 7 is a block diagram depicting command and address signal processing circuitry of a memory device, according to one embodiment of the invention.

Referring now to FIG. 7, a schematic is shown of the signal processing logic 602, according to one embodiment of the invention. Command inputs to the command pins 112 are provided to a command pre-decoder 702. The command pre-decoder 702 operates to decode the command inputs and output one of a plurality of command types: Command_X, Command_Y, and Command_Z. The command types may be any of those described above including Command_A, Command_B, and Command_C described with respect to the single data rate environment, and Command_AA, Command_BB, and Command_CC described with respect to the double data rate environment.

As noted above, each of the command types may correspond to categories of individual commands and may require some portion of the shared interface 116 to be fully decoded. In other embodiments, some command types may not require any portion of the shared interface 116. For example, in one embodiment, Command_Y and Command_Z may require at least a portion of the shared interface 116, while Command_X uses no portion of the shared interface 116. Command_A described above with respect to FIGS. 2 and 3 is an example of such a command (i.e., a command which does use any of the shared interface 116, and instead uses only the command only pins 112). Accordingly, in FIG. 7, Command_X output from the pre-decoder 702 is input to a first decoder 703, which receives no additional inputs from the shared interface 116. When the Command_X input (from the pre-decoder 702) is present at one of its inputs, the first command decoder 703 resolves (i.e. expand) the command inputs into one of a plurality of particular commands (Command_$X_{1,2,...N}$). In contrast, Command_Y and Command_Z are input to a second command decoder 704 and a third command decoder 706, respectively, where both decoders 704, 706 receive further inputs from the shared interface 116. Specifically, the second decoder 704 receives input from the first set of shared pins 116$_1$. When the Command_Y input (from the pre-decoder 702) is present at one of its inputs, the second command decoder 704 uses the Command_Y input and additional command inputs from the first set of shared pins to resolve (i.e. expand) the command inputs into one of a plurality of particular commands (Command_$Y_{1,2,...N}$). Command_Y may correspond, for example, to Command_BB (described above with respect to FIGS. 4 and 5), which may use at least a portion of the first set of shared pins 116$_1$ for command inputs.

In addition to the enabling Command_Z input from the pre-decoder 702, the third decoder 706 receives inputs from the first and second set of shared pins 116$_{1-2}$. When the Command_Z input (from the pre-decoder 702) is present at one of its inputs, the third command decoder 706 uses the Command_Z input and additional command inputs from the first and second set of shared pins to resolve (i.e. expand) the command inputs into one of a plurality of particular commands (Command_$Z_{1,2,...N}$). Command_Z may correspond, for example, to Command_C and Command_CC (described above), both of which may use at least a portion of both the first and second sets of shared pins 116$_{1-2}$.

It is noted that the variable "N" as used herein is arbitrary and is not intended to suggest that the various command types are all limited to the same number of particular commands. In other words, the variable "N" may have different values for the various command types. Thus, the number, "N", of the particular commands, Command_$X_{1,2,...N}$ Command_$Y_{1,2,...N}$ and Command_$Z_{1,2,...N}$ may each be different.

The pins of the shared interface 116 are further communicatively coupled to an address decoder 708. Specifically, the first set of shared pins 116$_1$ is coupled to the address decoder 708 by a first plurality of input lines 710, and the second set of shared pins 116$_2$ is coupled to the address decoder 708 by a second plurality of input lines 712. Address inputs which may be present on the lines 710, 712 are driven to the address decoder 708 by respective drivers 714, 716. A first driver 714 is enabled by the Command_X input from the command pre-decoder 702. A second driver 716 is enabled by the output from an OR gate 717. The gate 717 asserts the output to the second driver 716 when either or both the Command_X and the Command_Y signals are present at inputs to the gate 717. In this way, the second plurality of input lines 712 may be used to carry address inputs in combination with a Command_Y type command, and both the first and second plurality of input lines 710, 712 may be used to carry address inputs in combination with a Command_X type command.

The address decoder 708 also receives a plurality of input lines coupled to the dedicated address pins 114. As described above with respect to one embodiment, one of the command types is configured to be input to the memory device 102 in combination with "valid input". Command_Z may be an example of such a command type. Accordingly, the dedicated address pins 114 are also coupled to a plurality of valid input lines 722 which provide the valid input to the mode register 604 (or other component, other than the memory bank 620). The valid input on the lines 722 is selectively driven to the mode register 604 by a third driver 720. The third driver 720 is activated by the Command_Z signal provided by the command pre-decoder 702. Thus, in the illustrative embodiment, valid input (e.g., address inputs) for Command_Z type commands are provided only by the dedicated address pins 114, and the pins of the shared interface 116 are available for the various command inputs of Command_Z. In this case, the first and second drivers 714, 716 will not be enabled, but instead the third decoder 706 and the third driver 720 will be enabled.

It should be understood that the embodiment of the signal processing logic 602 shown in FIG. 7 is merely illustrative and not limiting of the invention. For example, while the embodiment shown in FIG. 7 is configured for receiving and processing three different command types (X, Y and Z), more generally, it is contemplated that any number of command types may be handled. Accordingly, any number of sets of shared pins may be provided depending on the number of commands to be decoded. Also, it is contemplated that at least one command type, e.g., Command_X, output from the pre-decoder 702 may be provided directly to the control circuit 110 (shown in FIG. 6), without the need for an intermediate decoder (e.g., the first decoder 703).

Further, embodiments have been described with respect to communication paths between a memory controller and a memory device. However, more generally, the invention encompasses communication paths between any components exchanging command and address inputs. Thus, in other embodiments, the communication paths may be between a processing unit and addressable storage such as registers. Illustrative examples of processing units include digital signal processors, mixed signal processors, analog-to-digital converters and digital-to-analog converters. Persons skilled in the art will recognize other embodiments within the scope of the invention.

Thus, generally, embodiments of the present invention provide a shared interface adapted to carry command inputs and/or address inputs in a given cycle. Accordingly, input pins on a device may be allocated to command inputs or address inputs as needed for a given command/address combination. In this way, a lower pin count may be achieved relative to a configuration in which only dedicated command pins and dedicated address pins are provided. Further, more combinations of commands may be achieved without increasing the number of pins. In multiple data rate environments, a complete command can be input and decoded in the first cycle (rising edge) without increasing the pin count.

While the foregoing is directed to embodiments of the present invention, other and further embodiments of the invention may be devised without departing from the basic scope thereof, and the scope thereof is determined by the claims that follow.

What is claimed is:

1. A device, comprising:
   a command bus interface comprising one or more command pins dedicated to receiving command inputs and one or more shared pins for selectively receiving address inputs and command inputs; and
   an address bus interface comprising one or more address pins dedicated to receiving address inputs and one or more shared pins for selectively receiving address inputs and command inputs.

2. The device of claim 1, wherein the one or more shared pins of the address bus interface are communicatively coupled to an address decoder and a mode register.

3. The device of claim 1, further comprising a pre-decoder communicatively coupled to the one or more command pins and configured to decode control inputs received on the one or more command pins into a plurality of command type signals.

4. The device of claim 1, further comprising:
   a pre-decoder communicatively coupled to the one or more command pins and configured to decode control inputs received on the one or more command pins into a plurality of command type signals; and
   at least one command decoder receiving as inputs one of the plurality of command type signals and one or more command inputs from one or more of the shared pins.

5. The device of claim 1, further comprising:
   a volatile memory array addressable according to the address inputs received via the command bus interface and the address bus interface.

6. A memory device, comprising:
   a command bus interface comprising one or more command pins dedicated to receiving command inputs and one or more shared pins for selectively receiving address inputs and command inputs;
   an address bus interface comprising one or more address pins dedicated to receiving address inputs and one or more shared pins for selectively receiving address inputs and command inputs;
   a pre-decoder communicatively coupled to the one or more command pins and configured to decode control inputs received on the one or more command pins into a plurality of command type signals;
   a first command decoder receiving as inputs a first one of the plurality of command type signals and one or more command inputs from the shared pins of the command bus interface and the address bus interface; and
   a second command decoder receiving as inputs a second one of the plurality of command type signals and one or more command inputs from the shared pins of only the command bus interface.

7. The memory device of claim 6, wherein the one or more shared pins of the address bus interface are communicatively coupled to an address decoder and a mode register.

8. The memory device of claim 6, wherein the first command decoder expands the first command type signal into a plurality of command signals using the command inputs from the shared pins coupled to the first command decoder.

9. The memory device of claim 6, wherein the second command decoder expands the second command type signal into a plurality of command signals using the command inputs from the shared pins coupled to the second command decoder.

10. A memory device, comprising:
    a command bus interface comprising one or more command pins dedicated to receiving command inputs and one or more shared pins for selectively receiving address inputs and command inputs;
    an address bus interface comprising one or more address pins dedicated to receiving address inputs and one or more shared pins for selectively receiving address inputs and command inputs;
    a pre-decoder communicatively coupled to the one or more command pins and configured to decode control inputs received on the one or more command pins into a plurality of command type signals;
    a first command decoder receiving as inputs a first one of the plurality of command type signals and one or more command inputs from the shared pins of the command bus interface and the address bus interface;
    a second command decoder receiving as inputs a second one of the plurality of command type signals and one or more command inputs from the shared pins of only the command bus interface;
    an address decoder coupled to the shared pins of the command bus interface and the address bus interface;
    a first driver disposed on a first signal path coupling the address decoder to the command bus interface, the first driver being enabled by the first one of the plurality of command type signals; and
    a second driver disposed on a first signal path coupling the address decoder to the address bus interface, the second driver being enabled by the second one of the plurality of command type signals.

11. The memory device of claim 10, wherein the one or more shared pins of the address bus interface are communicatively coupled to the address decoder and a mode register.

12. The memory device of claim 10, wherein the first command decoder expands the first command type signal into a plurality of command signals using the command inputs from the shared pins coupled to the first command decoder.

13. The memory device of claim 10, wherein the second command decoder expands the second command type signal into a plurality of command signals using the command inputs from the shared pins coupled to the second command decoder.

14. An apparatus, comprising:
    a memory controller configured to assert a plurality of address/command combinations each comprising a plurality of address inputs and command inputs; and
    a memory device, comprising:
       a command bus interface comprising one or more command pins dedicated for receiving command inputs and one or more shared pins for selectively receiving address inputs and command inputs, the command bus interface coupled to the memory controller by a command bus; and
       an address bus interface comprising one or more address pins dedicated for receiving address inputs and one or more shared pins for selectively receiving address inputs and command inputs, the address bus interface coupled to the memory controller by a address bus.

15. The apparatus of claim 14, wherein the one or more shared pins of the address bus interface are communicatively coupled to an address decoder and a mode register.

16. The apparatus of claim 14, wherein the memory device further comprises a pre-decoder communicatively coupled to the one or more command pins and configured to decode control inputs received on the one or more command pins into a plurality of command type signals.

17. The apparatus of claim 14, wherein the memory device further comprises:
   a pre-decoder communicatively coupled to the one or more command pins and configured to decode control inputs received on the one or more command pins into a plurality of command type signals; and
   at least one command decoder receiving as inputs one of the plurality of command type signals and one or more command inputs from one or more of the shared pins.

18. The apparatus of claim 17, wherein the memory device further comprises an address decoder and a mode register; wherein the one or more shared pins of the address bus interface are communicatively coupled to the address decoder and the mode register.

* * * * *